(12) United States Patent
Song

(10) Patent No.: US 12,423,179 B2
(45) Date of Patent: Sep. 23, 2025

(54) STACK MEMORY DEVICES COMMUNICATING VIA PACKETS

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 25 days.

(21) Appl. No.: 18/654,843

(22) Filed: May 3, 2024

(65) Prior Publication Data

US 2025/0181446 A1 Jun. 5, 2025

(30) Foreign Application Priority Data

Dec. 5, 2023 (KR) .................. 10-2023-0174966

(51) Int. Cl.
*G06F 11/10* (2006.01)
*G06F 13/42* (2006.01)

(52) U.S. Cl.
CPC ...... *G06F 11/1016* (2013.01); *G06F 11/1004* (2013.01); *G06F 13/4221* (2013.01)

(58) Field of Classification Search
CPC ............. G06F 11/1016; G06F 11/1004; G06F 13/4221
See application file for complete search history.

(56) References Cited

U.S. PATENT DOCUMENTS

2003/0151971 A1* 8/2003 Acharya ............ G11C 11/4093
365/233.1
2021/0049062 A1 2/2021 Balakrishnan et al.

FOREIGN PATENT DOCUMENTS

EP 4254413 A2 10/2023
KR 1020170102418 A 9/2017

* cited by examiner

*Primary Examiner* — Thien Nguyen
(74) *Attorney, Agent, or Firm* — WILLIAM PARK & ASSOCIATES LTD.

(57) ABSTRACT

A stack memory device includes a base chip, and a core chip stacked with the base chip and electrically connected to the base chip. In the present disclosure, the base chip includes a transmission/reception circuit configured to receive write data, a write valid signal, and a transmission write clock signal, a serialization/parallelization circuit configured to receive the write data, based on the write valid signal in synchronization with the transmission write clock signal and to generate a parallelized input packet from the write data, and a data transmission control circuit configured to decode the parallelized input packet to extract first internal data that is stored in the core chip when a write operation is performed on the core chip from the parallelized input packet.

27 Claims, 10 Drawing Sheets

FIG. 4

| BL \ PIN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 - 7 | B0 | B1 | B2 | B3 | B4 | B5 | B6 | B7 | B8 | B9 | B10 | B11 | B12 | B13 | B14 | B15 |
| 8 - 15 | B16 | B17 | B18 | B19 | B20 | B21 | B22 | B23 | B24 | B25 | B26 | B27 | B28 | B29 | B30 | B31 |
| 16 - 23 | B32 | B33 | B34 | B35 | B36 | B37 | B38 | B39 | B40 | B41 | B42 | B43 | B44 | B45 | B46 | B47 |
| 24 - 31 | B48 | B49 | B50 | B51 | B52 | B53 | B54 | B55 | B56 | B57 | B58 | B59 | B60 | B61 | B62 | B63 |

FIG. 5

| | +0 | +1 | +2 | +3 | +4 | +5 | +6 | +7 | +8 | +63 |
|---|---|---|---|---|---|---|---|---|---|---|
| DB1 | HB1 | HB2 | | | | | | | | |
| DB2 | HB3 | HB4 | CB1 | CB2 | HB5 | HB6 | | | | |
| DB3 | | | | | | | CB3 | CB4 | HB7 HB8 | |

STACK MEMORY DEVICES COMMUNICATING VIA PACKETS

CROSS-REFERENCE TO RELATED APPLICATIONS

The present application claims priority under 35 U.S.C. § 119(a) to Korean Patent Application No. 10-2023-0174966, filed on Dec. 5, 2023, which application is incorporated herein by reference in its entirety.

BACKGROUND

1. Technical Field

Some embodiments of the present disclosure relate to stack memory devices communicating in packets.

2. Related Art

Stack memory systems such as high bandwidth memory (HBM) systems are used in a wide range of applications due to excellent bandwidth and energy efficiency. Unlike existing memory systems that use a parallel data bus, the stack memory system includes a stack memory device composed of a base chip and a plurality of memory chips interconnected by through silicon vias (TSVs, hereinafter referred to as "through-vias"). The stack memory device utilizes a physical interface such as PHY for communicating with a processor, and the PHY needs to be designed to ensure high-speed data transmission and efficient communication.

SUMMARY

In accordance with an embodiment of the present disclosure, a stack memory device may include a base chip, and a core chip stacked with the base chip and electrically connected to the base chip. In the present disclosure, the base chip may include a transmission/reception circuit configured to receive write data, a write valid signal, and a transmission write clock signal, a serialization/parallelization circuit configured to receive the write data, based on the write valid signal in synchronization with the transmission write clock signal and to generate a parallelized input packet from the write data, and a data transmission control circuit configured to decode the parallelized input packet to extract first internal data that is stored in the core chip when a write operation is performed on the core chip from the parallelized input packet.

In accordance with another embodiment of the present disclosure, a stack memory device may include a serialization/parallelization circuit configured to receive write data when a write valid signal is activated in synchronization with a transmission write clock signal and to generate a parallelized input packet from the write data, and a data transmission control circuit configured to decode the parallelized input packet, generate an internal row control signal and an internal column control signal, extract first internal data from the parallelized input packet when a write operation is performed on a core chip based on the internal row control signal and the internal column control signal, receive data output from the core chip as second internal data when a read operation is performed on the core chip based on the internal row control signal and the internal column control signal, and generate an output packet, based on the second internal data and header information.

In accordance with another embodiment of the present disclosure, a stack memory device may include a plurality of core chips connected to each other through one or more through-vias and stacked with a base chip. In the present disclosure, the base chip may include a transmission/reception circuit configured to receive write data, a write valid signal, and a transmission write clock signal, a serialization/parallelization circuit configured to receive the write data based on the write valid signal in synchronization with the transmission write clock signal and to generate a parallelized input packet from the write data, a memory controller configured to generate a control command and an address based on the parallelized input packet, and an interface converting circuit configured to convert the control command and the address into an internal row control signal for row-series operations for the plurality of core chips and an internal column control signal for column-series operations for the plurality of core chips.

In accordance with another embodiment of the present disclosure, method may include receiving, by a base chip, serial write data when a write valid signal is activated in synchronization with a transmission write clock signal; generating an input packet by parallelizing the serial write data; and when a write operation is performed on a core chip, decoding the input packet to generate at least two control signals and to extract first internal data in order to store the first internal data in the core chip based on the at least two control signals.

BRIEF DESCRIPTION OF THE DRAWINGS

FIG. 4 is a table identifying data transferred during input and output operations for a packet according to an embodiment of the present disclosure.

FIG. 5 and FIG. 6 are diagrams illustrating examples of packet formats according to embodiments of the present disclosure.

DETAILED DESCRIPTION

In the following description of embodiments, when a parameter is referred to as being "predetermined," a value of the parameter may be determined in advance when the parameter is used in a process or an algorithm. The value of the parameter may be determined when the process or the algorithm starts or may be determined during a period in which the process or the algorithm is executed.

Although the terms "first," "second," "third," and so forth are used herein to describe various elements, these elements should not be limited by these terms. These terms are only used to distinguish one element from another element and are not intended to imply an order or number of elements. Thus, a first element in some embodiments may be termed a second element in other embodiments without departing from the teachings of the present disclosure.

When an element is referred to as "connected" or "coupled" to another element, the element may be directly connected or coupled to the other element or intervening elements may be present. When an element is referred to as "directly connected" or "directly coupled" to another element, no intervening elements are present.

A logic "high" level and a logic "low" level may be used to describe logic levels of electric signals. A signal at a logic "high" level is distinguished from a signal at a logic "low" level. For example, when a signal at a first voltage corresponds to a signal at a logic "high" level, a signal at a second voltage corresponds to a signal at a logic "low" level. In an embodiment, the logic "high" level may be a voltage level that is higher than a voltage level of the logic "low" level. Logic levels of signals may be different or opposite according to the embodiments. For example, a certain signal at a logic "high" level in one embodiment may be at a logic "low" level in another embodiment.

The term "logic bit set" may include a combination of logic levels of bits included in a signal. When the logic level of each of the bits included in the signal is changed, the logic bit set of the signal may be different. For example, when the signal includes two bits, when the logic level of each of the two bits included in the signal is "logic low level, logic low level," the logic bit set of the signal may be the first logic bit set, and when the logic level of each of the two bits included in the signal is "a logic low level and a logic high level," the logic bit set of the signal may be the second logic bit set.

Various embodiments of the present disclosure are described in more detail with reference to the accompanying drawings. The embodiments are described for illustrative purposes only and are not intended to limit the scope of the present disclosure.

Figure 1:
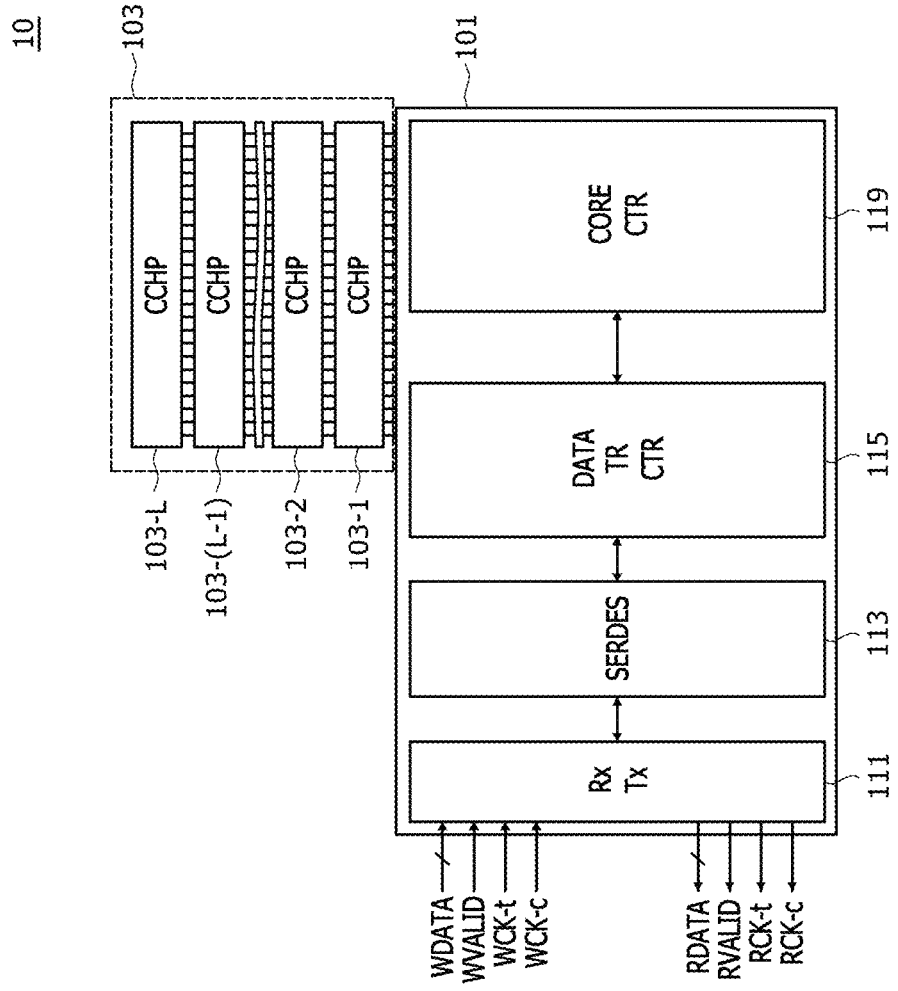
FIG. 1 is a block diagram illustrating a stack memory device according to an embodiment of the present disclosure.

FIG. 1 is a block diagram illustrating a stack memory device 10 according to an embodiment of the present disclosure. As shown in FIG. 1, the stack memory device 10 includes a base chip 101 and a core chip 103. The core chip 103 may be disposed on, with, or over the base chip 101. The core chip 103 may include a plurality (L) of core chips 103-1 through 103-L. Each of the plurality of core chips 103-1 through 103-L may be connected to one or more through-vias (for example, 441 in FIG. 10), and be disposed in a stacked form. The core chip 103 may receive various signals from and exchange data with the base chip 101 through the one or more through-vias.

The base chip 101 includes a transmission/reception circuit (Rx Tx) 111, a serialization/parallelization circuit (SERDES) 113, a data transmission control circuit (DATA TR CTR) 115, and a core control circuit (CORE CTR) 119.

The transmission/reception circuit 111 receives write data WDATA, a write valid signal WVALID, and transmission write clock signals WCK-t and WCK-c from an external device such as a processor (for example, 403 in FIG. 10) for a write operation and a read operation on the core chip 103. When the read operation is performed on the core chip 103, the transmission/reception circuit 111 transmits read data RDATA, a read valid signal RVALID, and transmission read clock signals RCK-t and RCK-c to the external device.

The serialization/parallelization circuit 113 receives the write data WDATA, generates a parallelized input packet (for example, BI in FIG. 2), and provides the parallelized input packet to the data transmission control circuit 115 when the write valid signal WVALID is activated in synchronization with the transmission write clock signals WCK-t and WCK-c. When the read operation is performed on the core chip 103, the serialization/parallelization circuit 113 extracts serialized read data RDATA and the read valid signal RVALID from an output packet (for example, BO in FIG. 2) generated based on internal data IDQ output from the core chip 103 and provides the serialized read data RDATA and the read valid signal RVALID to the transmission/reception circuit 111.

The data transmission control circuit 115 decodes the input packet (for example, BI in FIG. 2) to check whether any error is detected in the internal data IDQ extracted from the input packet BI when the write operation is performed on the core chip 103, and stores the internal data IDQ in the core chip 103 through the core control circuit 119. When the read operation is performed on the core chip 103, the data transmission control circuit 115 checks whether any error is detected in the internal data IDQ output from the core chip 103 and provides an output packet (for example, BO in FIG. 2) generated based on the internal data IDQ to the serialization/parallelization circuit 113. The internal data IDQ extracted from the input packet BI when the write operation is performed on the internal data IDQ and the internal data IDQ output from the core chip 103 when the read operation is performed on the core chip 103 may be separate signals transmitted through the same signal line.

When the write operation is performed on the core chip 103, the core control circuit 119 receives the internal data IDQ and controls the core chip 103 such that the internal data IDQ is stored in the core chip 103. When the read operation is performed on the core chip 103, the core control circuit 119 receives the internal data IDQ output from the core chip 103 to provide the internal data IDQ to the data transmission control circuit 115.

The stack memory device 10 configured as described above uses packets (for example, BI and BO in FIG. 2) when performing the write operation and read operation on the core chip 103, thereby improving scalability and performing high-speed operations when applied to or used in stack memory systems.

Figure 2:
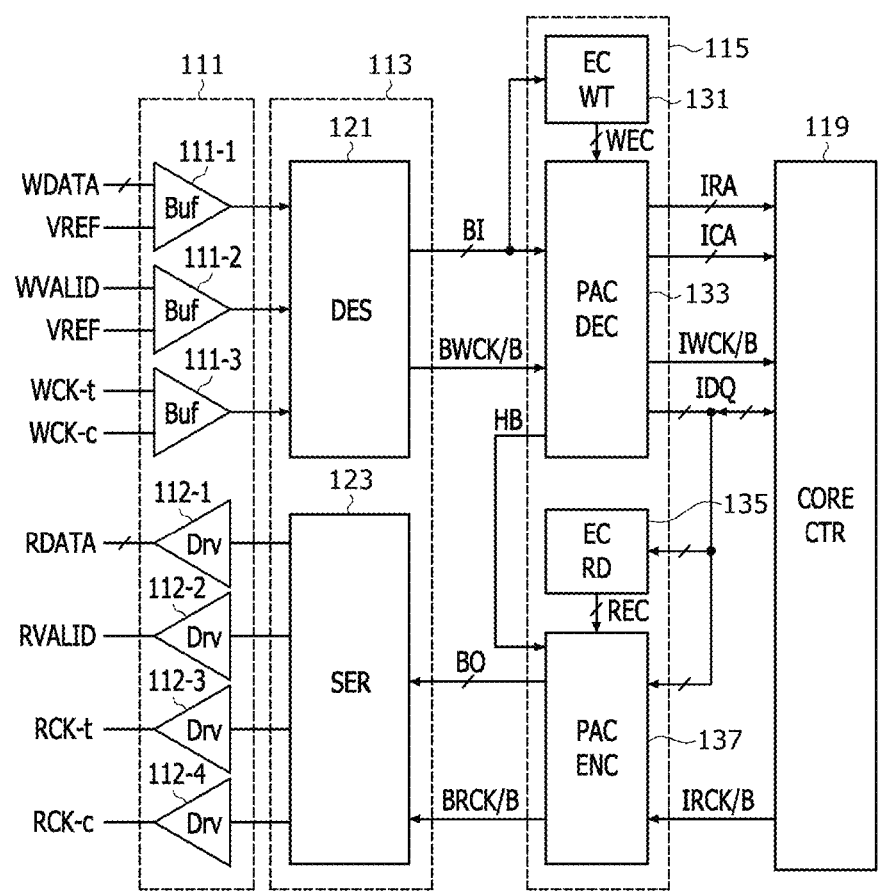
FIG. 2 is a block diagram illustrating an embodiment of a base chip included in the stack memory device.

FIG. 2 is a block diagram illustrating an embodiment of the base chip 101 such as shown in FIG. 1. As shown in FIG. 2, the base chip 101 includes a transmission/reception circuit 111, a serialization/parallelization circuit 113, a data transmission control circuit 115, and a core control circuit 119.

The transmission/reception circuit 111 includes reception buffers 111-1, 111-2, and 111-3 and transmission drivers 112-1, 112-2, 112-3, and 112-4. The reception buffer 111-1 buffers the write data WDATA received serially from an external device, based on a reference voltage VREF, and provides the buffered write data WDATA to the serialization/parallelization circuit 113. The reception buffer 111-2 receives and buffers the write valid signal WVALID, based on the reference voltage VREF, and provides the buffered write valid signal WVALID to the serialization/parallelization circuit 113. The reception buffer 111-3 receives and buffers the transmission write clock signals WCK-t and WCK-c and provides the buffered transmission write clock signals WCK-t and WCK-c to the serialization/parallelization circuit 113. The transmission driver 112-1 transmits the read data RDATA received serially from the serialization/parallelization circuit 113 to the external device. The transmission driver 112-2 transmits the read valid signal RVALID received from the serialization/parallelization circuit 113 to the external device. The transmission drivers 112-3 and 112-4 transmit the transmission read clock signals RCK-t and RCK-c received from the serialization/parallelization circuit 113 to the external device.

The serialization/parallelization circuit 113 includes a parallelization circuit 121 and a serialization circuit 123.

The parallelization circuit 121 is electrically connected to the reception buffers 111-1, 111-2, and 111-3 and receives the write data WDATA, the write valid signal WVALID, and the transmission write clock signals WCK-t and WCK-c. The parallelization circuit 121 receives the write data WDATA to generate and output the parallelized input packet BI when the write valid signal WVALID is activated in synchronization with the transmission write clock signals WCK-t and WCK-c. The parallelization circuit 121 outputs the transmission write clock signals WCK-t and WCK-c as a buffer write clock signal BWCK/B. The parallelization circuit 121 is electrically connected to the data transmission control circuit 115 and provides the input packet BI and the buffer write clock signal BWCK/B to the data transmission control circuit 115. The input packet BI may be implemented or formatted as a packet used in peripheral component interconnect express (PCIe) and compute express link (CXL) protocols. PCIe and CXL are high-speed interface standards used to connect various hardware components such as graphics cards, storage devices, network cards, and the like, to each other. The input packet BI may include header information including information such as destination and packet type, information about internal control signals that control internal operations, data information stored in the core chip 103, error control information used to detect errors, and security information to prevent data sharing.

The serialization circuit 123 is electrically connected to the data transmission control circuit 115 and receives the output packet BO and a buffer read clock signal BRCK/B from the data transmission control circuit 115. The serialization circuit 123 extracts the read data RDATA and the read valid signal RVALID from the output packet BO in synchronization with the buffer read clock signal BRCK/B to provide serialized read data RDATA to the transmission driver 112-1 and provide the read valid signal RVALID to the transmission driver 112-2. The serialization circuit 123 generates transmission read clock signals RCK-t and RCK-c from the buffer read clock signal BRCK/B and provides the transmission read clock signals RCK-t and RCK-c to the transmission drivers 112-3 and 112-4, respectively.

The data transmission control circuit 115 includes a write error check circuit (EC WT) 131, a packet decoder (PAC DEC) 133, a read error check circuit (EC RD) 135, and a packet encoder (PAC ENC) 137.

The write error check circuit 131 is electrically connected to the parallelization circuit 121 and receives the input packet BI from the parallelization circuit 121. The write error check circuit 131 generates a write error check code WEC based on the input packet BI. The write error check circuit 131 may apply a cyclic redundancy check (CRC) algorithm to generate the write error check code WEC as a checksum that can be utilized to check for the errors in the internal data IDQ.

The packet decoder 133 is electrically connected to the parallelization circuit 121 and the write error check circuit 131, receives the input packet BI and the buffer write clock signal BWCK/B from the parallelization circuit 121, and receives the write error check code WEC from the write error check circuit 131. The packet decoder 133 checks whether any error is in the input packet BI based on the write error check code WEC. When at least one error is detected in the input packet BI, based on the write error check code WEC during the write operation on the core chip 103, the packet decoder 133 may receive the input packet BI again from the parallelization circuit 121. The packet decoder 133 decodes the input packet BI in synchronization with the buffer write clock signal BWCK/B to generate an internal row control signal IRA and an internal column control signal ICA. The internal row control signal IRA may be a signal utilized in row-series operations such as an active operation and a pre-charge operation on the core chip 103, and the internal column control signal ICA may be a signal utilized in column-series operations such as a read operation and a write operation on the core chip 103. The packet decoder 133 generates an internal write clock signal IWCK/B, based on the buffer write clock signal BWCK/B. For example, the internal write clock signal IWCK/B may be implemented in the same way as the buffer write clock signal BWCK/B. The present disclosure is not limited to this example. The packet decoder 133 decodes the input packet BI to extract header information HB and the internal data IDQ when the write operation is performed on the core chip 103. The input packet BI may include header information HB including information such as the destination and packet type, data information including control signals to control operations, error security information for error detection or security, and the like. The packet decoder 133 is electrically connected to the core control circuit 119 and provides the internal data IDQ to the core control circuit 119 in order to store the internal data IDQ in the core chip 103 when the write operation is performed on the core chip 103.

The read error check circuit 135 is electrically connected to the core control circuit 119 and receives the internal data IDQ from the core control circuit 119. The read error check circuit 135 generates a read error check code REC based on the internal data IDQ. The read error check circuit 135 may apply a cyclic redundancy check (CRC) algorithm to generate the read error check code REC as a checksum that can be utilized to check for the errors in the internal data IDQ.

The packet encoder 137 is electrically connected to the packet decoder 133, the read error check circuit 135, and the core control circuit 119 and receives the header information HB from the packet decoder 133, receives the read error check code REC from the read error check circuit 135, and receives an internal read clock signal IRCK/B from the core control circuit 119. The packet encoder 137 receives the internal data IDQ from the core control circuit 119 when the read operation is performed on the core chip 103. The packet encoder 137 checks whether any error is in the internal data IDQ received during the read operation on the core chip 103 based on the read error check code REC. When at least one error is detected in the internal data IDQ based on the read error check code REC during the read operation on the core chip 103, the packet encoder 137 may receive the internal data IDQ again from the core chip 103 through the core control circuit 119. The packet encoder 137 generates the output packet BO based on the header information HB and the internal data IDQ. The output packet BO may be a packet used in PCIe and CXL protocols. The packet encoder 137 generates the buffer read clock signal BRCK/B based on the internal read clock signal IRCK/B. For example, the buffer read clock signal BRCK/B may be implemented in the same manner as the internal read clock signal IRCK/B. The present disclosure is not limited to this example.

The core control circuit 119 is electrically connected to the packet decoder 133 and receives the internal row control signal IRA, the internal column control signal ICA, the internal write clock signal IWCK/B, and the internal data IDQ from the packet decoder 133. The core control circuit 119 receives the internal write clock signal IWCK/B and the internal data IDQ from the packet decoder 133 when the write operation is performed on the core chip 103 based on the internal row control signal IRA and the internal column control signal ICA. The core control circuit 119 controls the core chip 103 such that the internal data IDQ is stored in the core chip 103 in synchronization with the internal write clock signal IWCK/B when the write operation is performed on the core chip 103. The core control circuit 119 provides the internal data IDQ as the data output from the core chip 103 to the packet encoder 137 when the read operation is performed on the core chip 103. The core control circuit 119 provides the internal read clock signal IRCK/B to the packet encoder 137 when the read operation is performed on the core chip 103.

The operation of the stack memory device 10 configured as described above is described as follows with respect to two examples, an example in which a write operation is performed on the core chip 103 and an example in which a read operation is performed on the core chip 103.

For the write operation on the core chip 103, the parallelization circuit 121 receives the write data WDATA, the write valid signal WVAID, and the transmission write clock signals WCK-t and WC-c from the reception buffers 111-1, 111-2, and 111-3 and receives the write data WDATA to generate the parallelized input packet BI when the write valid signal WVALID is activated in synchronization with the transmission write clock signals WCK-t and WC-c. The packet decoder 133 checks whether any error is in the input packet BI based on the write error check code WEC and receives the input packet BI again when at least one error is detected in the input packet BI. The packet decoder 133 decodes the input packet BI to generate the internal row control signal IRA and the internal column control signal ICA. The core control circuit 119 receives the internal write clock signal IWCK/B and the internal data IDQ from the packet decoder 133 when the write operation is performed on the core chip 103 based on the internal row control signal IRA and the internal column control signal ICA and controls the core chip 103 such that the internal data IDQ is stored in the core chip 103 in synchronization with the internal write clock signal IWCK/B.

For the read operation on the core chip 103, the parallelization circuit 121 receives the write data WDATA, the write valid signal WVALID, and the transmission write clock signals WCK-t and WCK-c from the reception buffers 111-1, 111-2, and 111-3 and receives the write data WDATA to generate the parallelized input packet BI when the write valid signal WVALID is activated in synchronization with the transmission write clock signals WCK-t and WCK-c. The packet decoder 133 checks whether any error is in the input packet BI based on the write error check code WEC and receives the input packet BI again when at least one error is in the input packet BI. The packet decoder 133 may decode the input packet BI to generate the header information HB, the internal row control signal IRA, and the internal column control signal ICA. The core control circuit 119 may output the data output from the core chip 103 as the internal data IDQ when the read operation is performed on the core chip 103 based on the internal row control signal IRA and the internal column control signal ICA. The read error check circuit 135 may generate the read error check code REC, based on the internal data IDQ. The packet encoder 137 may check whether any error is in the internal data IDQ, based on the read error check code REC, and receive the internal data IDQ again when at least one error is detected in the internal data IDQ. The packet encoder 137 may generate the output packet BO, based on the header information HB and the internal data IDQ. The serialization circuit 123 extracts the read data RDATA and the read valid signal RVALID from the output packet BO in synchronization with the buffer read clock signal BRCK/B to provide serialized read data RDATA to the transmission driver 112-1, and provide the read valid signal RVALID to the transmission driver 112-2. The serialization circuit 123 generates the transmission read clock signals RCK-t and RCK-c from the buffer read clock signal BRCK/B and provides the transmission read clock signals RCK-t and RCK-c to the transmission drivers 112-3 and 112-4. The transmission drivers 112-1, 112-2, 112-3, and 112-4 provide the read data RDATA, the read valid signal RVALID, and the transmission read clock signals RCK-t and RCK-c to an external device.

Figure 3:
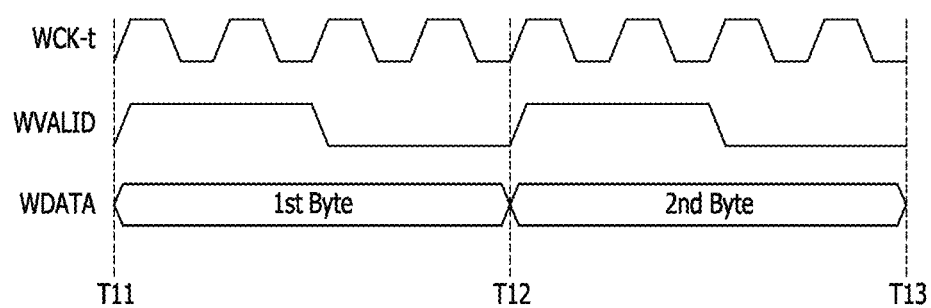
FIG. 3 is a timing diagram illustrating timing of a write operation of a stack memory device according to an embodiment of the present disclosure.

FIG. 3 is a timing diagram illustrating timing of a write operation in which the write data WDATA is transmitted in synchronization with the write valid signal WVALID during the write operation of the stack memory device 10 such as shown in FIG. 1.

Referring to FIG. 2 and FIG. 3, when the write operation is performed in the stack memory device 10, the write data WDATA is received by the transmission/reception circuit 111 based on the transmission write clock signal WCK-t and the write valid signal WVALID. More specifically, when the write valid signal WVALID is activated for the first time in synchronization with the transmission write clock signal WCK-t from time period T11 through T12, the first Byte (1st Byte) of the write valid signal WVALID is received, and when the write valid signal WVALID is activated for the second time in synchronization with the transmission write clock signal WCK-t from time period T12 through T13, the second Byte (2nd Byte) of the write valid signal WVALID is received. In one example, the write valid signal WVALID is activated at a logic "high" level during the preset time periods for receiving the write valid signal WVALID, although the present disclosure is not limited to this example.

FIG. 4 is a table identifying data transferred during the operations of inputting and outputting packets according to an embodiment of the present disclosure. The operations of inputting and outputting a packet consisting of 64 Bytes through 16 pins (PIN) are described with reference to FIG. 4. The pins may be any form of electrical connection between devices, for example, between the base chip 101 and the core chip 103.

During the first burst length (BL0-7) period, the first 16 Bytes B0 through B15 are input and output through the first pin PIN0 through the sixteenth pin PIN15. The second 16 Bytes B16 through B31 are input and output through the first pin PIN0 through the sixteenth pin PIN15 during the second burst length (BL8-15) period. The third 16 Bytes B32 through B47 are input and output through the first pin PIN0 through the sixteenth pin PIN15 during the third burst length (BL16-23) period. The fourth 16 Bytes B48 through B63 are input and output through the first pin PIN0 through the sixteenth pin PIN15 during the fourth burst length (BL24-31) period. The data input and output operations may be performed in order from the top row to the bottom row of the table of FIG. 4 or in a different order. In this example, the operations of inputting and outputting the packet consisting of 64 Bytes through 16 pins during 4 burst length periods (BL0-31) is described, although the present disclosure is not limited to this example.

Figure 6:
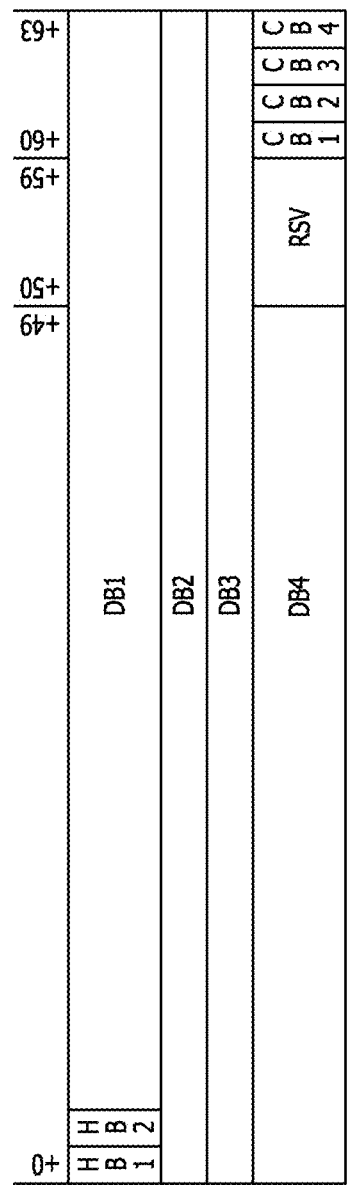

FIG. 5 and FIG. 6 are diagrams illustrating examples of packet formats according to embodiments of the present disclosure.

As shown in FIG. 5, the packet, according to an example, is composed of 192 Bytes, including three blocks each composed of 64 Bytes. The first block in the packet includes 2 Bytes of header information HB1 and HB2 and 62 Bytes of information DB1. The second block in the packet include 4 Bytes of header information HB3, HB4, HB5, and HB6, 2 Bytes of error control information CB1 and CB2, and 58 Bytes of information DB2. The third block in the packet includes 2 Bytes of header information HB7 and HB8, 2 Bytes of error control information CB3 and CB4, and 60 bytes of information DB2 and DB3.

As shown in FIG. 6, the packet according to another example is composed of 256 Bytes, including 4 blocks each composed of 64 Bytes. The first block included in the packet may include 2 Bytes of header information HB1 and HB2 and 62 Bytes of information DB1. The second block included in the packet may include 64 Bytes of information DB2. The third block included in the packet may include 64 Bytes of information DB3. The fourth block included in the packet may include 10 Bytes of reservation information RSV, 4 Bytes of error control information CB3 and CB4, and 50 Bytes of information DB4. The reservation information RSV may include information secured or kept aside for subsequent use.

The configurations of the packet discussed above are only examples, and the numbers of Bytes included in the packet, the numbers of Bytes included in the blocks and the header information, error control information, and arrangement of the internal control signals may be implemented in various ways depending on the embodiment.

Figure 7:
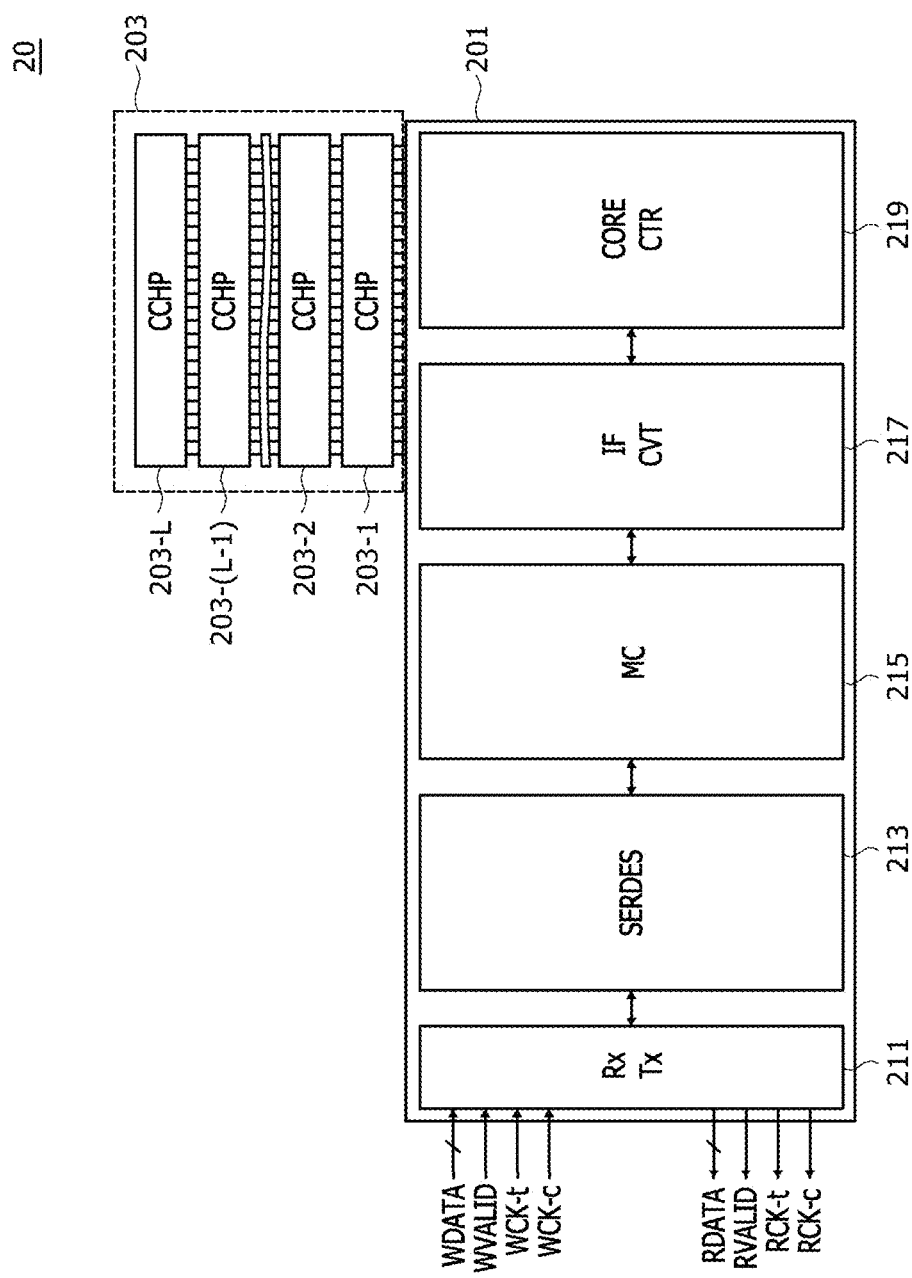
FIG. 7 is a block diagram illustrating a stack memory device according to another embodiment of the present disclosure.

FIG. 7 is a block diagram illustrating a stack memory device 20 according to another embodiment of the present disclosure.

As shown in FIG. 7, the stack memory device 20 includes a base chip 201 and a core chip 203. The core chip 203 may be disposed on, with, or over the base chip 201. The core chip 203 may include a plurality (L) of core chips 203-1 through 203-L. Each of the plurality (L) of core chips 203-1 through 203-L may be connected to each other through one or more through-vias (for example, 441 in FIG. 10), and may be disposed in a stacked form. The core chip 203 may receive various signals from and exchange data with the base chip 201 through the one or more through-vias.

The base chip 201 includes a transmission/reception circuit (Rx Tx) 211, a serialization/parallelization circuit (SERDES) 213, a memory controller (MC) 215, an interface converting circuit (IF CVT) 217, and a core control circuit (CORE CTR) 219.

The transmission/reception circuit 211 receives write data WDATA, a write valid signal WVALID, and transmission write clock signals WCK-t and WCK-c from an external device such as a processor (for example, 403 in FIG. 10) for a write operation and a read operation on the core chip 203. The transmission/reception circuit 211 transmits read data RDATA, a read valid signal RVALID, and transmission read clock signals RCK-t and RCK-c to the external device for the read operation on the core chip 203.

The serialization/parallelization circuit 213 receives the write data WDATA to generate a parallelized input packet (for example, BI in FIG. 8) and provides the parallelized input packet (for example, BI in FIG. 8) to the memory controller 215 when the write valid signal WVALID is activated in synchronization with the transmission write clock signals WCK-t and WCK-c. When a read operation is performed, the serialization/parallelization circuit 213 extracts serialized read data RDATA and a read valid signal RVALID from an output packet (for example, BO in FIG. 8) generated based on internal data IDQ output from the core chip 203 and provides the serialized read data RDATA and the read valid signal RVALID to the transmission/reception circuit 211.

Figure 8:
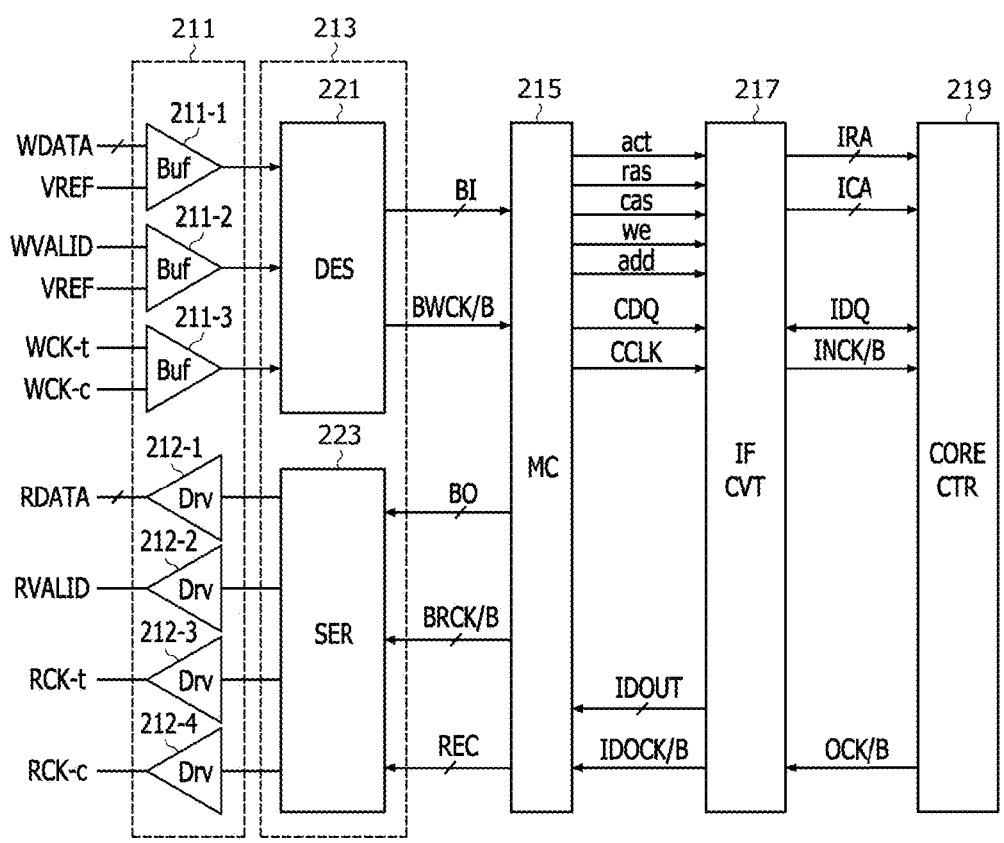
FIG. 8 is a block diagram illustrating an embodiment of a base chip included in the stack memory device.

The memory controller 215 generates control commands (for example, act, ras, cas, and we in FIG. 8) for controlling internal operations on the core chip 203 and an address (for example, add in FIG. 8) based on the input packet (for example, BI in FIG. 8). The memory controller 215 extracts control data (for example, CDQ in FIG. 8) from the input packet (for example, BI in FIG. 8) when a write operation is performed on the core chip 203. The memory controller 215 generates the output packet (for example, BO in FIG. 8) and a read error check code (for example, REC in FIG. 8) based on internal output data (for example, IDOUT in FIG. 8) when a read operation is performed on the core chip 203.

The interface converting circuit 217 converts the control commands (for example, act, ras, cas, and we in FIG. 8) into an internal row control signal (for example, IRA in FIG. 8) and an internal column control signal (for example, ICA in FIG. 8). The interface converting circuit 217 converts the control data CDQ into the internal data IDQ via an interface to the memory controller 215 and provides the internal data IDQ via an interface to the core control circuit 219 to perform operations on the core chip 203 when the write operation is performed on the core chip 203. The interface converting circuit 217 converts the internal data IDQ into the internal output data IDOUT via the interface to the control circuit 219 and provides the internal output data IDOUT to the interface to the memory controller 215 when the read operation is performed on the core chip 203.

The core control circuit 219 receives the internal data IDQ from the interface converting circuit 217 and stores the internal data IDQ in the core chip 203 when the write operation is performed on the core chip 203. The core control circuit 219 receives the internal data IDQ output from the core chip 203 and provides the internal data IDQ to the interface converting circuit 217 when the read operation is performed on the core chip 203.

The stack memory device 20 configured as described above uses packets (for example, BI and BO in FIG. 8) when performing write and read operations on the core chip 203, thereby improving scalability and performing high-speed operations when applied to or used in a stacked memory system. In addition, the stack memory device 20 may be provided with the memory controller 215 that operates with different interfaces through the interface converting circuit 217, thereby providing system-on-chip high-speed operations.

FIG. 8 is a block diagram illustrating an embodiment of the base chip 201 such as shown in FIG. 7. As shown in FIG. 8, the base chip 201 includes a transmission/reception circuit 211, a serialization/parallelization circuit 213, a memory controller 215, an interface converting circuit 217, and a core control circuit 219.

The transmission/reception circuit 211 includes reception buffers 211-1, 211-2, and 211-3 and transmission drivers 212-1, 212-2, 212-3, and 212-4. The reception buffer 211-1 buffers the write data WDATA received serially from an external device, based on a reference voltage VREF, and provides the buffered write data WDATA to the serialization/ parallelization circuit 213. The reception buffer 211-2 receives and buffers the write valid signal WVALID, based on the reference voltage VREF, and provides the buffered write valid signal WVALID to the serialization/parallelization circuit 213. The reception buffer 211-3 receives and buffers the transmission write clock signals WCK-t and WCK-c and provides the buffered transmission write clock signals WCK-t and WCK-c to the serialization/parallelization circuit 213. The transmission driver 212-1 transmits the read data RDATA received serially from the serialization/parallelization circuit 213 to the external device. The transmission driver 212-2 transmits the read valid signal RVALID received from the serialization/parallelization circuit 213 to the external device. The transmission drivers 212-3 and 212-4 transmits the transmission read clock signals RCK-t and RCK-c received from the serialization/parallelization circuit 213 to the external device.

The serialization/parallelization circuit 213 includes a parallelization circuit 221 and a serialization circuit 223.

The parallelization circuit 221 is electrically connected to the reception buffers 211-1, 211-2, and 211-3 and receives the write data WDATA, the write valid signal WVALID, and the transmission write clock signals WCK-t and WCK-c. The parallelization circuit 221 receives the write data WDATA to generate and output the parallelized input packet BI when the write valid signal WVALID is activated in synchronization with the transmission write clock signals WCK-t and WCK-c. The parallelization circuit 221 outputs the transmission write clock signals WCK-t and WCK-c as the buffer write clock signal BWCK/B. The parallelization circuit 221 is electrically connected to the memory controller 215 and provides the input packet BI and the buffer write clock signal BWCK/B to the memory controller 215. The input packet BI may be implemented or formatted as a packet used in the PCIe and CXL protocols.

The serialization circuit 223 is electrically connected to the memory controller 215 and receives the output packet BO, the buffer read clock signal BRCK/B, and the read error check code REC from the memory controller 215. The serialization circuit 223 may receive the output packet BO again from the memory controller 215 when at least one error is detected in the output packet BO based on the read error check code REC. The serialization circuit 223 extracts the read data RDATA and the read valid signal RVALID from the output packet BO in synchronization with the buffer read clock signal BRCK/B and provides the serialized read data RDATA to the transmission driver 212-1 and provide the read valid signal RVALID to the transmission driver 212-2. The serialization circuit 223 generates the transmission read clock signals RCK-t and RCK-c from the buffer read clock signal BRCK/B and provides the transmission read clock signals RCK-t and RCK-c to the transmission drivers 212-3 and 212-4, respectively. The output packet BO may be implemented or formatted as a packet used in the PCIe and CXL protocols.

The memory controller 215 is electrically connected to the serialization/parallelization circuit 213 and the interface converting circuit 217, receives the input packet BI and the buffer write clock signal BWCK/B from the serialization/parallelization circuit 213, and receives the internal output data IDOUT and the internal output clock signal IDOCK/B from the interface converting circuit 217. The memory controller 215 generates control commands act, ras, cas, and we for controlling the internal operations on the core chip 203 and an address add based on the input packet BI and the buffer write clock signal BWCK/B. The internal operations on the core chip 203 include an active operation, a read operation, a write operation, a pre-charge operation, and the like. When a write operation is performed on the core chip 203, the memory controller 215 extracts control data CDQ from the input packet BI and generates a control clock signal CCLK from the buffer write clock signal BWCK/B and provides the control data CDQ and the control clock signal CCLK to the interface converting circuit 217. When a read operation is performed on the core chip 203, the memory controller 215 provides to the serialization/parallelization circuit 213 the output packet BO, the buffer read clock signal BRCK/B, and the read error check code REC generated based on the internal output data IDOUT and the internal output clock signal IDOCK/B. The read error check code REC may be generated based on a cyclic redundancy check (CRC) algorithm.

The interface converting circuit 217 is electrically connected to the memory controller 215 and the core control circuit 219 and receives the control commands act, ras, cas, and we, the address add, the control data CDQ, and the control clock signal CCLK from the memory controller 215 and receives the internal data IDQ and the output clock signal OCK/B from the core control circuit 219. The interface converting circuit 217 converts the control commands act, ras, cas, and we and the address add into an internal row control signal IRA and an internal column control signal ICA and provides the internal row control signal IRA and the internal column control signal ICA to the core control circuit 219. The control commands act, ras, cas, and we and the address add may be provided by an interface to the memory controller 215, and the internal row control signal IRA and the internal column control signal ICA may be provided by an interface to the core control circuit 219 that utilizes the internal row control signal IRA and the internal column control signal ICA to perform operations on the core chip 203. The method by which the control commands act, ras, cas, and we and the addresses add are converted into the internal row control signal IRA and the internal column control signal ICA may be determined in various ways depending on the embodiment.

When a write operation is performed on the core chip 203, the interface converting circuit 217 converts the control data CDQ and the control clock signal CCLK into the internal data IDQ and an input clock signal INCK/B and provides the internal data IDQ and the input clock signal INCK/B to the core control circuit 219. The control data CDQ and the control clock signal CCLK may be provided by the interface to the memory controller 215, and the internal data IDQ and the input clock signal INCK/B may be provided by the interface to the core control circuit 219 based on operations with the core chip 203. The method by which the control data CDQ and the control clock signal CCLK are converted into the internal data IDQ and the input clock signal INCK/B may be determined in various ways depending on the embodiment. When the read operation is performed on the core chip 203, the interface converting circuit 217 converts the internal data IDQ and the output clock signal OCK/B into the internal output data IDOUT and the internal output clock signal IDOCK/B and provides the internal output data IDOUT and the internal output clock signal IDOCK/B to the memory controller 215. The internal data IDQ and the output clock signal OCK/B may be provided by the interface to the core control circuit 219 based on operations with the core chip 203, and the internal output data IDOUT and the internal output clock signal IDOCK/B may be provided by the interface to the memory controller 215. The method by which the internal data IDQ and the output clock signal OCK/B are converted into the internal output data IDOUT and the internal output clock signal IDOCK/B may be determined in various ways depending on the embodiment.

The core control circuit 219 receives the internal data IDQ and the input clock signal INCK/B from the interface converting circuit 217 when the write operation is performed on the core chip 203 based on the internal row control signal IRA and the internal column control signal ICA. The core control circuit 219 controls the core chip 203 such that the internal data IDQ is stored in the core chip 203 in synchronization with the input clock signal INCK/B when the write operation is performed on the core chip 203. The core control circuit 219 provides the data output from the core chip 203 as the internal data IDQ to the interface converting circuit 217 when the read operation is performed on the core chip 203. The core control circuit 219 provides the output clock signal OCK/B to the interface converting circuit 217 when the read operation is performed on the core chip 203.

The operation of the stack memory device 20 configured as described above is described as follows with respect to two examples, an example in which a write operation is performed on the core chip 203 and an example in which a read operation is performed on the core chip 203.

For the write operation on the core chip 203, the parallelization circuit 221 receives the write data WDATA, the write valid signal WVALID, and the transmission write clock signals WCK-t and WCK-c from the reception buffers 211-1, 211-2, and 211-3 and receives the write data WDATA when the write valid signal WVALID is activated in synchronization with the transmission write clock signals WCK-t and WCK-c to generate the parallelized input packet BI. The memory controller 215 generates the control commands act, ras, cas, and we and the address add based on the input packet BI and the buffer write clock signal BWCK/B, extracts the control data CDQ from the input packet BI, and generates the control clock signal CCLK from the buffer write clock signal BWCK/B. The interface converting circuit 217 converts the control commands act, ras, cas, and we into the internal row control signal IRA and the internal column control signal ICA and converts the control data CDQ and the control clock signal CCLK into the internal data IDQ and the input clock signal INCK/B, respectively. The core control circuit 219 controls the core chip 203 such that the internal data IDQ is stored in the core chip 203 in synchronization with the input clock signal INCK/B.

For a read operation on the core chip 203, the parallelization circuit 221 receives the write data WDATA, the write valid signal WVALID, and the transmission write clock signals WCK-t and WCK-c from the reception buffers 211-1, 211-2, and 211-3 and receives the write data WDATA to generate the parallelized input packet BI when the write valid signal WVALID is activated in synchronization with the transmission write clock signals WCK-t and WCK-c. The memory controller 215 generates the control commands act, ras, cas, and we and the address add based on the input packet BI and the buffer write clock signal BWCK/B, extracts the control data CDQ from the input packet BI, and generates the control clock signal CCLK from the buffer write clock signal BWCK/B. The interface converting circuit 217 converts the control commands act, ras, cas, and we into the internal row control signal IRA and the internal column control signal ICA. The core control circuit 219 outputs the data output from the core chip 203 as the internal data IDQ and outputs the output clock signal OCK/B based on the internal row control signal IRA and the internal column control signal ICA. The interface converting circuit 217 converts the internal data IDQ and the output clock signal OCK/B into the internal output data IDOUT and the internal output clock signal IDOCK/B. The memory controller 215 generates the output packet BO, the buffer read clock signal BRCK/B, and the read error check code REC, based on the internal output data IDOUT and the internal output clock signal IDOCK/B. The serialization circuit 223 receives the output packet BO again from the memory controller 215 when at least one error is detected in the output packet BO based on the read error check code REC. The serialization circuit 223 extracts the read data RDATA and the read valid signal RVALID from the output packet BO in synchronization with the buffer read clock signal BRCK/B and provides the serialized read data RDATA to the transmission driver 212-1 and provides the read valid signal RVALID to the transmission driver 212-2. The serialization circuit 223 generates the transmission read clock signals RCK-t and RCK-c from the buffer read clock signal BRCK/B and provides the transmission read clock signals RCK-t and RCK-c to the transmission drivers 212-3 and 212-4, respectively. The transmission drivers 212-1, 212-2, 212-3, 212-4 may transmit the read data RDATA, the read valid signal RVALID, and the transmission read clock signals RCK-t and RCK-c to an external device.

Figure 9:
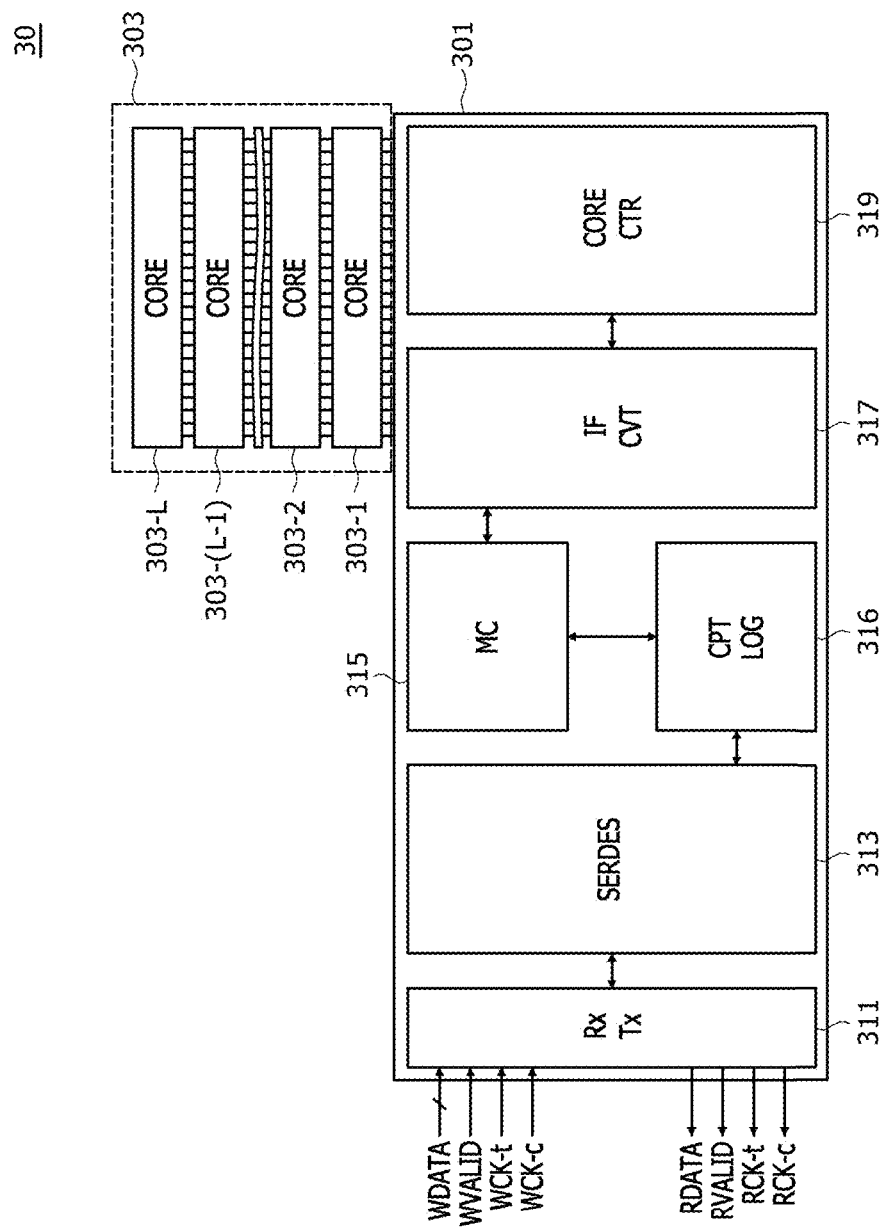
FIG. 9 is a block diagram illustrating a stack memory device according to a further embodiment of the present disclosure.

FIG. 9 is a block diagram illustrating a stack memory device 30 according to a further embodiment of the present disclosure. As shown in FIG. 9, the stack memory device 30 includes a base chip 301 and a core chip 303. The core chip 303 may be disposed on, with, or over the base chip 301. The core chip 303 may include a plurality (L) of core chips 303-1 through 303-L. Each of the plurality of core chips 303-1 through 303-L may be connected to each other through one or more through-vias (for example, 441 in FIG. 10), and may be disposed in a stacked form. The core chip 303 may receive various signals from and exchange data with the base chip 301 through the one or more through-vias.

The base chip 301 includes a transmission/reception circuit (Rx Tx) 311, a serialization/parallelization circuit (SERDES) 313, a memory controller (MC) 315, a calculation circuit (CPT LOG) 316, an interface converting circuit (IF CVT) 317, and a core control circuit (CORE CTR) 319.

The calculation circuit 316 is electrically connected to the serialization/parallelization circuit 313 and the memory controller 315 and performs calculation operations of the serialization/parallelization circuit 313 and calculation operations of the memory controller 315. The stack memory device 30 shown in FIG. 9 may be implemented in the same way as the stack memory device 20 shown in FIG. 7, except for the calculation circuit 316. Accordingly, the transmission/reception circuit 311, the serialization/parallelization circuit 313, the memory controller 315, the interface converting circuit 317, and the core control circuit 319 may be implemented in the same way as the transmission/reception circuit 211, the serialization/parallelization circuit 213, the memory controller 215, the interface converting circuit 217, and the core control circuit 219, respectively, as previously described with reference to FIG. 7.

Figure 10:
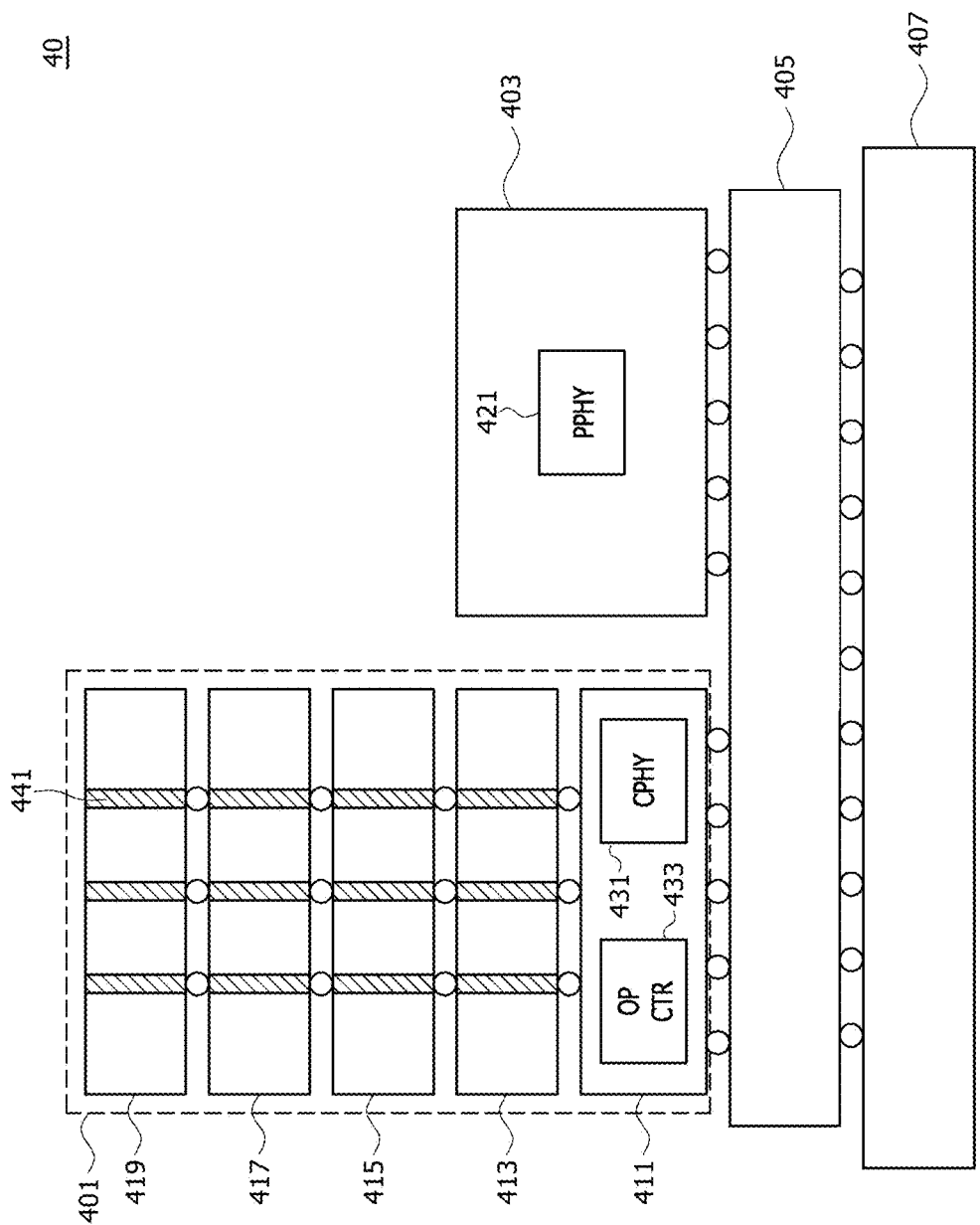
FIG. 10 is a block diagram illustrating a stack memory system according to an embodiment of the present disclosure.

FIG. 10 is a block diagram illustrating a stack memory system 40 according to an embodiment of the present disclosure. As shown in FIG. 10, the stack memory system 40 includes a stack memory device 401, a processor 403, an interposer 405, and a substrate 407.

The interposer 405 may be disposed on, with, or over the substrate 407, and the stack memory device 401 and the processor 403 may be disposed on, with, or over the interposer 405. The interposer 405 may electrically connect the substrate 407, the stack memory device 401, and the processor 403 to each other. The pitch differences between the substrate 407, the stack memory device 401, and the processor 403 are large, such that the substrate 407, the stack memory device 401, and the processor 403 may be electrically connected to each other using the interposer 405 that contains variously formed wires or other electrically conductive connection devices.

The processor 403 includes a processor interface circuit (PPHY) 421. The processor 403 provides write control signals containing commands for controlling various internal operations of the stack memory device 401 and addresses to the stack memory device 401 through the processor interface circuit 421 and receives read control signals from the stack memory device 401 through the processor interface circuit 421. The write control signals may include write data WDATA, a write valid signal WVALID, and transmission write clock signals WCK-t and WCK-c, such as shown in FIG. 1, FIG. 7, and FIG. 9. The read control signals may include read data RDATA, a read valid signal RVALID, and transmission read clock signals RCK-t and RCK-c, such as shown in FIG. 1, FIG. 7, and FIG. 9.

The stack memory device 401 includes a base chip 411 and core chips 414, 415, 417, and 419. The stack memory device 401 may be implemented similar to the stack memory device 10 shown in FIG. 1, the stack memory device 20 shown in FIG. 7, and/or the stack memory device 30 shown in FIG. 9.

The core chips 414, 415, 417, and 419 may be sequentially stacked on, with, or over the base chip 411 and receive various signals from the base chip 411 through one or more through-vias 441.

The base chip 411 includes a core interface circuit (CPHY) 431 and an operation control circuit (OP CTR) 433. The core interface circuit 431 enables communication with the processor interface circuit 421 to transmit the write control signals transmitted from the processor 403 to the operation control circuit 433 and provides the read control signals generated by the operation control circuit 433 to the processor 403. The core interface circuit 431 may be implemented with the transmission/reception circuit 111, the serialization/parallelization circuit 113, and the data transmission control circuit 115 shown in FIG. 1, the transmission/reception circuit 211 and the serialization/parallelization circuit 213 shown in FIG. 7, and/or the transmission/reception circuit 311 and the serialization/parallelization circuit 313 shown in FIG. 9. The operation control circuit 433 may be implemented with the core control circuit 119 shown in FIG. 1, the memory controller 215, the interface converting circuit 217, and the core control circuit 219 shown in FIG. 7, and/or the memory controller 315, the calculation circuit 316, the interface converting circuit 317, and the core control circuit 319 shown in FIG. 9.

Concepts are disclosed in conjunction with various embodiments as described above. Those skilled in the art will understand that various modifications, additions, and substitutions are possible, without departing from the scope and spirit of the present disclosure. Accordingly, the embodiments disclosed in the present specification should not be considered from a restrictive standpoint but rather from an illustrative standpoint. The scope of the present disclosure is not limited to the above descriptions, and all of distinctive features within an equivalent scope should be construed as being included in the present disclosure.

What is claimed is:

1. A stack memory device comprising:
a base chip; and
a core chip stacked with the base chip and electrically connected to the base chip,
wherein the base chip comprises:
a transmission/reception circuit configured to receive write data, a write valid signal, and a transmission write clock signal;
a serialization/parallelization circuit configured to receive the write data based on the write valid signal in synchronization with the transmission write clock signal and to generate a parallelized input packet from the write data; and
a data transmission control circuit configured to decode the parallelized input packet to extract first internal data that is stored in the core chip when a write operation is performed on the core chip.

2. The stack memory device of claim 1, wherein the transmission/reception circuit receives the write data input serially during a burst length period when the write valid signal is activated.

3. The stack memory device of claim 1, wherein the parallelized input packet is formatted as a packet used in peripheral component interconnect express (PCIe) and compute express link (CXL) protocols.

4. The stack memory device of claim 1, wherein the data transmission control circuit generates a write error check code, based on the parallelized input packet, and receives the parallelized input packet again from the serialization/parallelization circuit when at least one error is detected in the parallelized input packet based on the write error check code.

5. The stack memory device of claim 1, wherein the data transmission control circuit decodes the parallelized input packet to generate an internal row control signal for row-series operations for the core chip and an internal column control signal for column-series operations.

6. The stack memory device of claim 1, further comprising a core control circuit configured to control the core chip such that the first internal data is stored in the core chip when the write operation is performed.

7. The stack memory device of claim 1, further comprising a core control circuit configured to output second internal data output from the core chip when a read operation is performed on the core chip.

8. The stack memory device of claim 7, wherein the data transmission control circuit generates an output packet based on the second internal data when the read operation is performed.

9. The stack memory device of claim 8, wherein the output packet is formatted as a packet used in peripheral component interconnect express (PCIe) and compute express link (CXL) protocols.

10. The stack memory device of claim 8, wherein the data transmission control circuit generates a read error check code based on the second internal data when the read operation is performed on the core chip and receives the second internal data again from the core control circuit when at least one error is detected in the second internal data based on the read error check code.

11. The stack memory device of claim 7, wherein the data transmission control circuit extracts read data and a read valid signal from the output packet.

12. The stack memory device of claim 11, wherein the transmission/reception circuit transmits the read data and the read valid signal.

13. A stack memory device comprising:
a serialization/parallelization circuit configured to receive write data when a write valid signal is activated in synchronization with a transmission write clock signal and to generate a parallelized input packet from the write data; and a data transmission control circuit configured to decode the parallelized input packet, generate an internal row control signal and an internal column control signal, extract first internal data from the parallelized input packet when a write operation is performed on a core chip based on the internal row control signal and the internal column control signal, receive data output from the core chip as second internal data when a read operation is performed on the core chip based on the internal row control signal and the internal column control signal, and generate an output packet based on the second internal data and header information.

14. The stack memory device of claim 13, wherein the serialization/parallelization circuit extracts read data and a read valid signal from the output packet.

15. The stack memory device of claim 14, further comprising a transmission/reception circuit configured to receive the write data, the write valid signal, and the transmission write clock signal, and transmit the read data, the read valid signal, and a transmission read clock signal.

16. The stack memory device of claim 13, wherein the serialization/parallelization circuit generates the parallelized input packet formatted as a packet used in peripheral component interconnect express (PCIe) and compute express link (CXL) protocols.

17. The stack memory device of claim 13, wherein the data transmission control circuit generates the output packet formatted as a packet used in peripheral component interconnect express (PCIe) and compute express link (CXL) protocols.

18. The stack memory device of claim 13, wherein the data transmission control circuit receives the parallelized input packet again from the serialization/parallelization circuit when at least one error is detected in the parallelized input packet according to a write error check code generated based on the parallelized input packet during the write operation.

19. The stack memory device of claim 13, wherein the data transmission control circuit receives the second internal data again from the core control circuit when at least one error is detected in the second internal data according to a read error check code generated based on the second internal data during the read operation.

20. A stack memory device comprising a plurality of core chips connected to each other through one or more through-vias and stacked with a base chip,
wherein the base chip comprises:
a transmission/reception circuit configured to receive write data, a write valid signal, and a transmission write clock signal;
a serialization/parallelization circuit configured to receive the write data based on the write valid signal in synchronization with the transmission write clock signal and to generate a parallelized input packet from the write data;
a memory controller configured to generate a control command and an address based on the parallelized input packet; and
an interface converting circuit configured to convert the control command and the address into an internal row control signal for row-series operations for the plurality of core chips and an internal column control signal for column-series operations for the plurality of core chips.

21. The stack memory device of claim 20, wherein the interface converting circuit converts the control command and the address into the internal row control signal and the internal column control signal by a first interface to the memory controller and provides the internal row control signal and the internal column control signal via a second interface to perform operations on the core chips.

22. The stack memory device of claim 20,
wherein the memory controller extracts control data from the parallelized input packet when a write operation is performed on the core chips, and
wherein the interface converting circuit converts the control data into internal data stored in the core chips.

23. The stack memory device of claim 20, wherein the interface converting circuit receives data output from the core chips and converts the internal data into internal output data when a read operation is performed on the core chips.

24. The stack memory device of claim 23, wherein the memory controller generates an output packet and a read error check code based on the internal output data.

25. The stack memory device of claim 20, further comprising a calculation circuit electrically connected to the serialization/parallelization circuit and the memory controller and configured to perform a calculation operation of the serialization/parallelization circuit and a calculation operation of the memory controller.

26. A method comprising:
receiving, by a base chip, serial write data when a write valid signal is activated in synchronization with a transmission write clock signal;
generating an input packet by parallelizing the serial write data; and
when a write operation is performed on a core chip, decoding the input packet to generate at least two control signals and to extract first internal data in order to store the first internal data in the core chip based on the at least two control signals.

27. The method of claim 26, wherein the at least two control signals comprise an internal row control signal and an internal column control signal, the method further comprising:
receiving data output from the core chip as second internal data when a read operation is performed on the core chip based on the internal row control signal and the internal column control signal, and
generating an output packet based on the second internal data.

* * * * *